US011355617B2

(12) United States Patent
Dutta et al.

(10) Patent No.: US 11,355,617 B2
(45) Date of Patent: Jun. 7, 2022

(54) SELF-ALIGNED COLLECTOR HETEROJUNCTION BIPOLAR TRANSISTOR (HBT)

(71) Applicant: QUALCOMM Incorporated, San Diego, CA (US)

(72) Inventors: Ranadeep Dutta, Del Mar, CA (US); Stephen Alan Fanelli, San Marcos, CA (US); Richard Hammond, Gwent (GB)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 16/589,444

(22) Filed: Oct. 1, 2019

(65) Prior Publication Data

US 2021/0098600 A1 Apr. 1, 2021

(51) Int. Cl.
*H01L 29/66* (2006.01)
*H01L 29/737* (2006.01)
*H01L 29/08* (2006.01)

(52) U.S. Cl.
CPC .... *H01L 29/66318* (2013.01); *H01L 29/0817* (2013.01); *H01L 29/0821* (2013.01); *H01L 29/66242* (2013.01); *H01L 29/7371* (2013.01)

(58) Field of Classification Search
CPC ........... H01L 29/66318; H01L 29/0817; H01L 29/0821; H01L 29/66242; H01L 29/7371
See application file for complete search history.

(56) References Cited

U.S. PATENT DOCUMENTS

| 5,318,916 | A  | * | 6/1994  | Enquist | H01L 29/66931 |
|-----------|----|---|---------|---------|---------------|
|           |    |   |         |         | 438/626       |
| 6,830,967 | B1 | * | 12/2004 | Yin     | H01L 21/8249  |
|           |    |   |         |         | 438/366       |
| 7,875,952 | B1 | * | 1/2011  | Elliott | H01L 24/82    |
|           |    |   |         |         | 438/689       |
| 9,087,854 | B1 | * | 7/2015  | Ha      | H01L 23/3677  |

(Continued)

FOREIGN PATENT DOCUMENTS

| CN | 108878368 A | * | 11/2018 | |
|----|-------------|---|---------|---|
| EP | 335720 A    | * | 10/1989 | ........... H01L 21/263 |

(Continued)

OTHER PUBLICATIONS

Chen T-P., et al., "Effect of Emitter Ledge Thickness on InGaP/GaAs Heterojunction Bipolar Transistors," Electrochemical and Solid-State Letters, Jan. 2009, vol. 12, Issue 2, pp. H41-H43.

*Primary Examiner* — Peter Bradford
(74) *Attorney, Agent, or Firm* — Qualcomm Incorporated

(57) ABSTRACT

Certain aspects of the present disclosure generally relate to an integrated circuit (IC) having a heterojunction bipolar transistor (HBT) device. The HBT device generally includes an emitter region, a collector region, and a base region disposed between the emitter region and the collector region, the base region and the collector region comprising different semiconductor materials. The HBT device may also include an etch stop layer disposed between the collector region and the base region. The HBT device also includes an emitter contact, wherein the emitter region is between the emitter contact and the base region, and a collector contact, wherein the collector region is between the collector contact and the base region.

14 Claims, 13 Drawing Sheets

(56) References Cited

U.S. PATENT DOCUMENTS

| | | | | |
|---|---|---|---|---|
| 10,546,852 B2 * | 1/2020 | Dutta | ............... | H01L 27/0623 |
| 2004/0253782 A1 * | 12/2004 | Kondo | ............ | H01L 29/7395 |
| | | | | 438/222 |
| 2006/0157823 A1 * | 7/2006 | Sheridan | ........... | H01L 29/0821 |
| | | | | 257/E21.612 |
| 2019/0341381 A1 * | 11/2019 | Dutta | ............... | H01L 27/0605 |
| 2020/0266290 A1 * | 8/2020 | Dutta | .................... | H01L 29/36 |
| 2021/0098600 A1 * | 4/2021 | Dutta | ............. | H01L 29/41708 |

FOREIGN PATENT DOCUMENTS

| | | | | | | |
|---|---|---|---|---|---|---|
| FR | 2803102 | A1 | * | 6/2001 | ....... | H01L 29/66318 |
| JP | 11040575 | A | * | 2/1999 | ....... | H01L 29/66318 |
| JP | 2003133326 | A | * | 5/2003 | ....... | H01L 21/30612 |
| JP | 3782962 | B2 | * | 6/2006 | ......... | H01L 27/0635 |

* cited by examiner

SELF-ALIGNED COLLECTOR HETEROJUNCTION BIPOLAR TRANSISTOR (HBT)

TECHNICAL FIELD

Certain aspects of the present disclosure generally relate to electronic components and, more particularly, to transistors.

BACKGROUND

Complementary metal-oxide semiconductor (CMOS) devices are widely used components for integrated circuits to implement digital logic. A CMOS device typically includes a p-type metal-oxide-semiconductor (PMOS) transistor used to pull an output to logic high and an n-type metal-oxide-semiconductor (NMOS) transistor used to pull the output down to logic low, depending on an input signal provided to the gates of the PMOS and NMOS transistors. A heterojunction bipolar transistor (HBT) is a type of bipolar junction transistor (BJT) which uses differing semiconductor materials for the emitter and base regions, creating a heterojunction.

SUMMARY

Certain aspects of the present disclosure are directed to an integrated circuit (IC) comprising a heterojunction bipolar transistor (HBT) device. The HBT device generally includes an emitter region, a collector region, and a base region disposed between the emitter region and the collector region, the base region and the collector region comprising different semiconductor materials. The HBT device may also include an etch stop layer disposed between the collector region and the base region. The HBT device also includes an emitter contact, wherein the emitter region is between the emitter contact and the base region, and a collector contact, wherein the collector region is between the collector contact and the base region.

Certain aspects of the present disclosure are directed to a method for fabricating an IC. The method generally includes forming a collector region, forming an etch stop layer above the collector region, forming a base region above the etch stop layer, forming an emitter region above the base region, forming an emitter contact such that the emitter region is between the emitter contact and the base region, and forming a collector contact such that the collector region is between the collector contact and the base region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a heterojunction bipolar transistor (HBT) and, moreover, to the monolithic integration of the HBT and complementary metal-oxide-semiconductor (CMOS) on a silicon substrate. For example, certain aspects allow a full radio frequency front-end (RFFE) system on a single chip. Certain aspects also provide techniques for reducing base-collector capacitance (Cbc) due to a smaller base-collector junction area as compared to conventional implementations.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Semiconductor Device

Certain aspects of the present disclosure generally relate to fabrication of high performance gallium arsenide (GaAs) heterojunction bipolar transistors (HBTs) allowing for a reduction of base-collector capacitance (Cbc) of the HBT as compared to conventional implementations. The reduction in Cbc enables improvements in power gain and efficiency for radio-frequency front-end (RFFE) power amplifier (PA) applications.

An HBT's Cbc and base resistance are important parameters for power gain, particularly at high frequencies. The base mesa occupies a large area as compared to the emitter mesa area. A typical ratio of the base mesa to emitter junction areas on an HBT unit cell may be around 2.4. The large Cbc from the base mesa area compromises the PA's power gain and efficiency, particularly at higher frequencies. Certain aspects are directed to an HBT device with reduced Cbc as compared to conventional implementations, improving device power gain and efficiency.

A GaAs substrate is a poor thermal conductor, which may result in self-heating of electronic components, which causes issues, particularly on fifth-generation (5G) RFFE systems. The PA may be one of the hottest components of a phone, and therefore, careful thermal management is important for performance and reliability of the phone. GaAs, although a suitable material for high speed, efficient, linear PA applications, is a poor thermal conductor. Certain aspects of the present disclosure are generally directed to an HBT implemented by removing a GaAs substrate that would otherwise be adjacent to the collector metal, enabling improved thermal management, as described in more detail herein.

Figure 1:
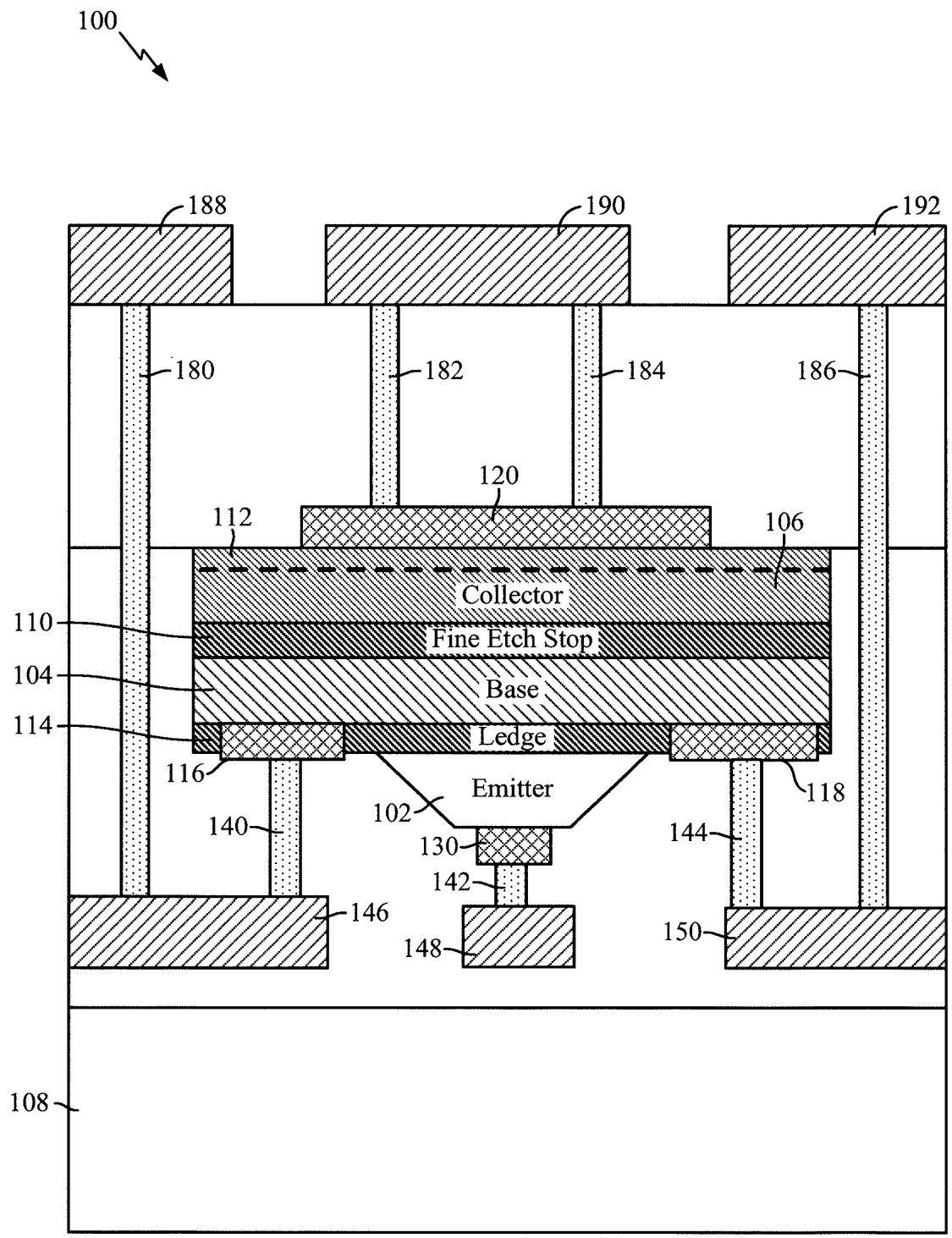
FIG. 1 is a cross-sectional view of a semiconductor device having complementary metal-oxide-semiconductor (CMOS) devices and heterojunction bipolar transistor (HBT) devices, in accordance with certain aspects of the present disclosure.

FIG. 1 is an example HBT 100, in accordance with certain aspects of the present disclosure. The HBT 100 includes an emitter region 102, a base region 104, and a collector region 106, as illustrated. As illustrated, a lateral edge of the collector region 106 is aligned with a lateral edge of the base region 104. The emitter region 102, the base region 104, and the collector region 106 may be implemented using gallium arsenide (GaAs), or any other suitable group III-V semiconductor. In certain aspects, the collector region 106 may include a sub-collector region 112, which may be implemented with GaAs or any other suitable group III-V semiconductor.

The HBT 100 may be implemented with a unique epitaxial stack using an indium gallium phosphide (InGaP) etch stop layer (not shown) between the sub-collector region 112 and a GaAs substrate (not shown), which are later removed, as described in more detail herein. The HBT 100 is implemented with a tight base-metal (e.g., base contact 116)-to-emitter (e.g., emitter region 102)-mesa spacing enabled by a self-aligned feature defined by an emitter hard mask. The tight base-metal-to-emitter-mesa spacing allows for a lower base-collector junction area, and therefore, a lower Cbc, as compared to conventional implementations. The base region 104, collector region 106, and sub-collector region 112 may be implemented with the same feature dimensions, allowing for a reduction of footprint as compared to conventional implementations. In certain aspects, the HBT 100 may be fusion-bonded to a silicon (Si) substrate 108 on the emitter side of the HBT 100. While FIG. 1 illustrates a GaAs HBT 100 to facilitate understanding, the aspects described herein are applicable for any of various suitable HBT types, such as indium phosphide (InP)-based HBTs. As illustrated, vias 140, 142, 144, 180, 182, 184, 186 and contact regions 146, 148, 150, 188, 190, 192 may be used for electrical connection to the collector, base, and emitter regions.

Figure 2A:
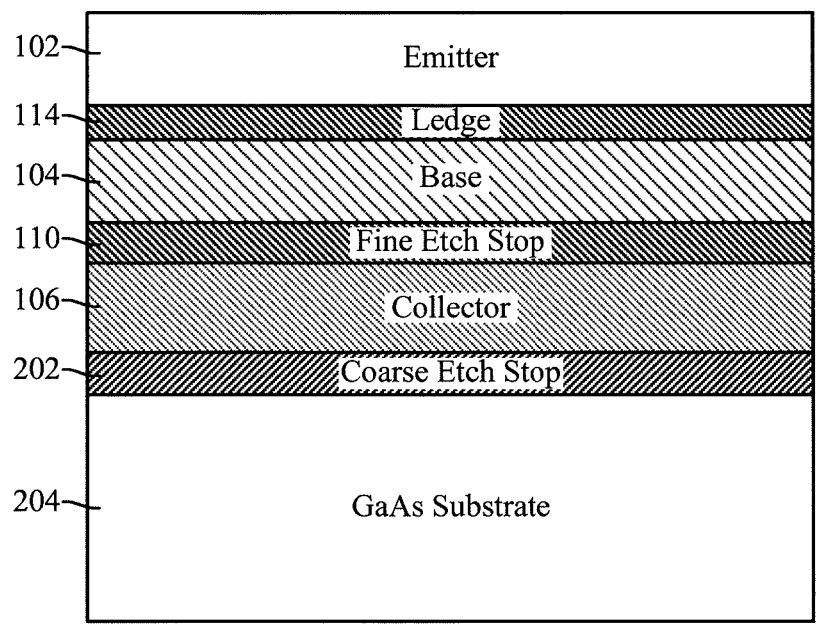
FIGS. 2A-2Q illustrate example operations for fabricating an HBT, in accordance with certain aspects of the present disclosure.
Figure 2B:
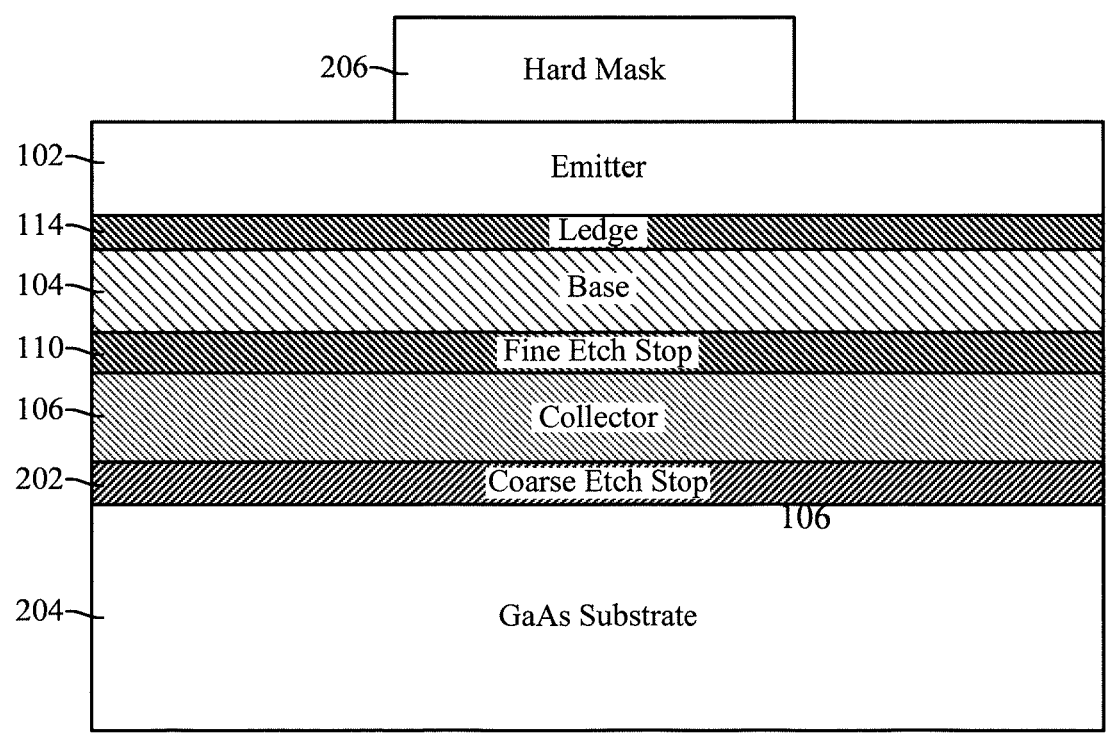
Figure 2C:
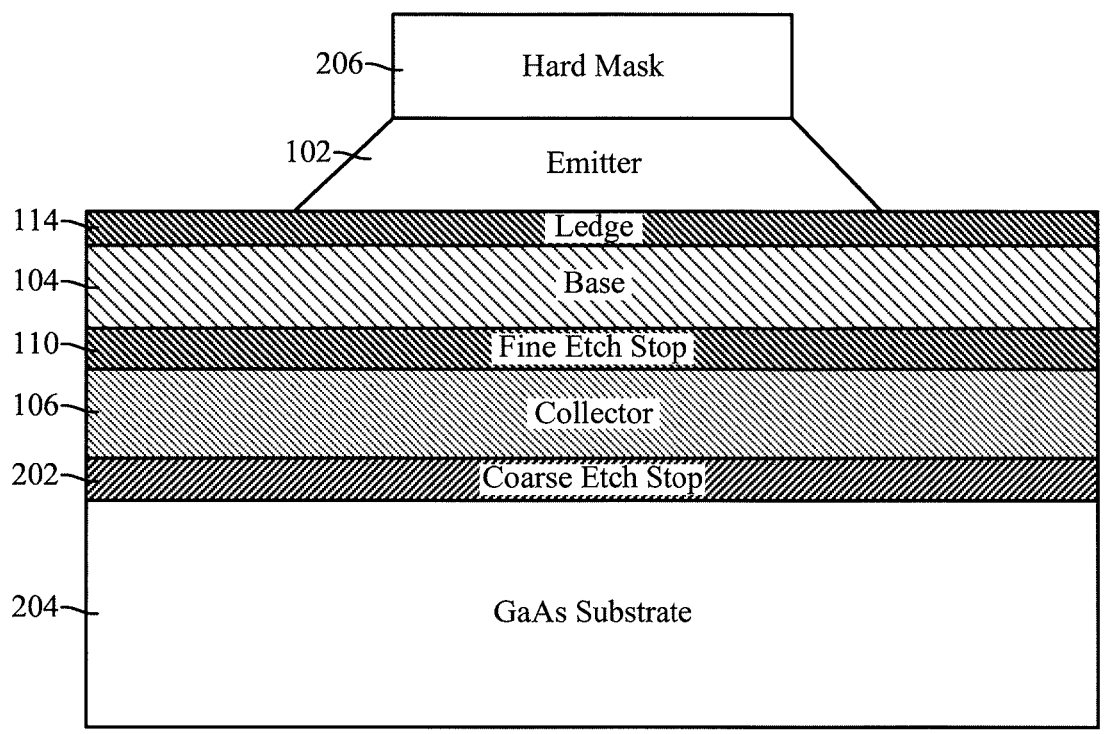
Figure 2D:
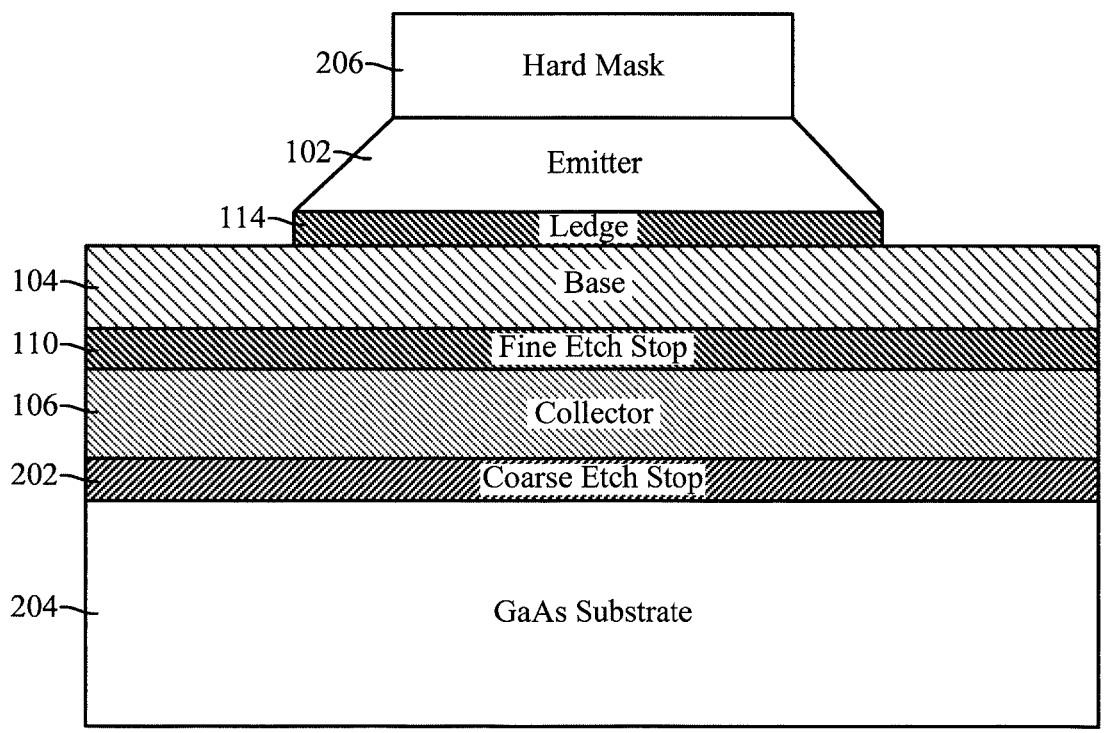
Figure 2E:
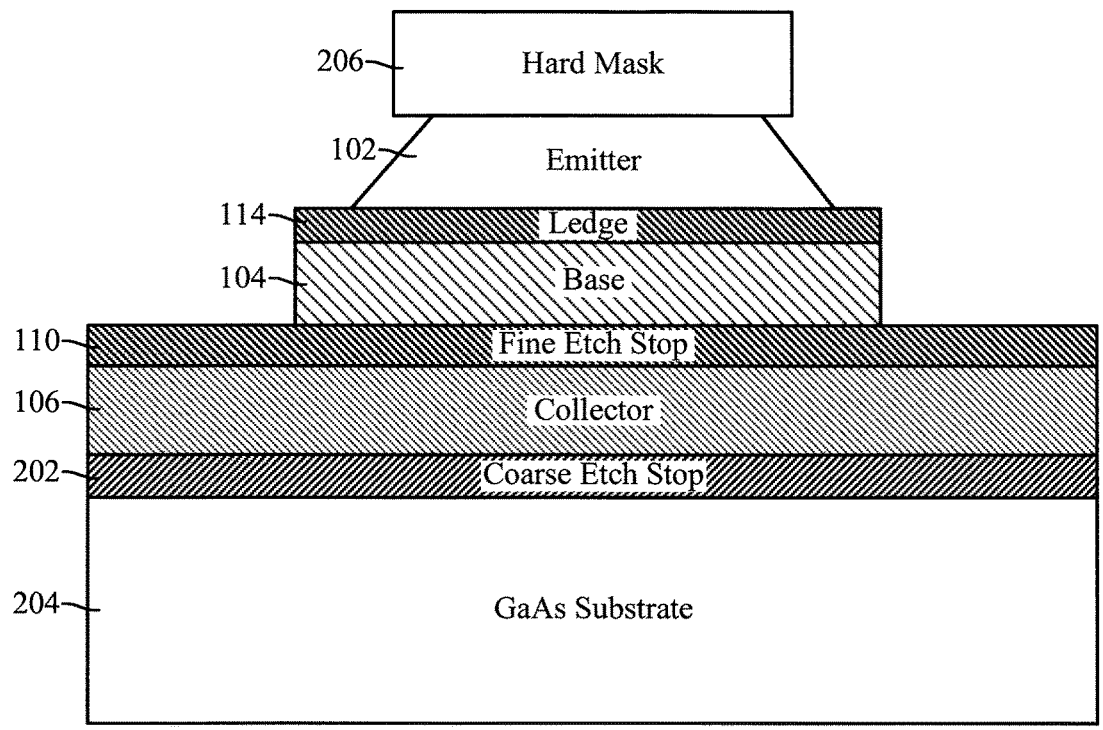
Figure 2F:
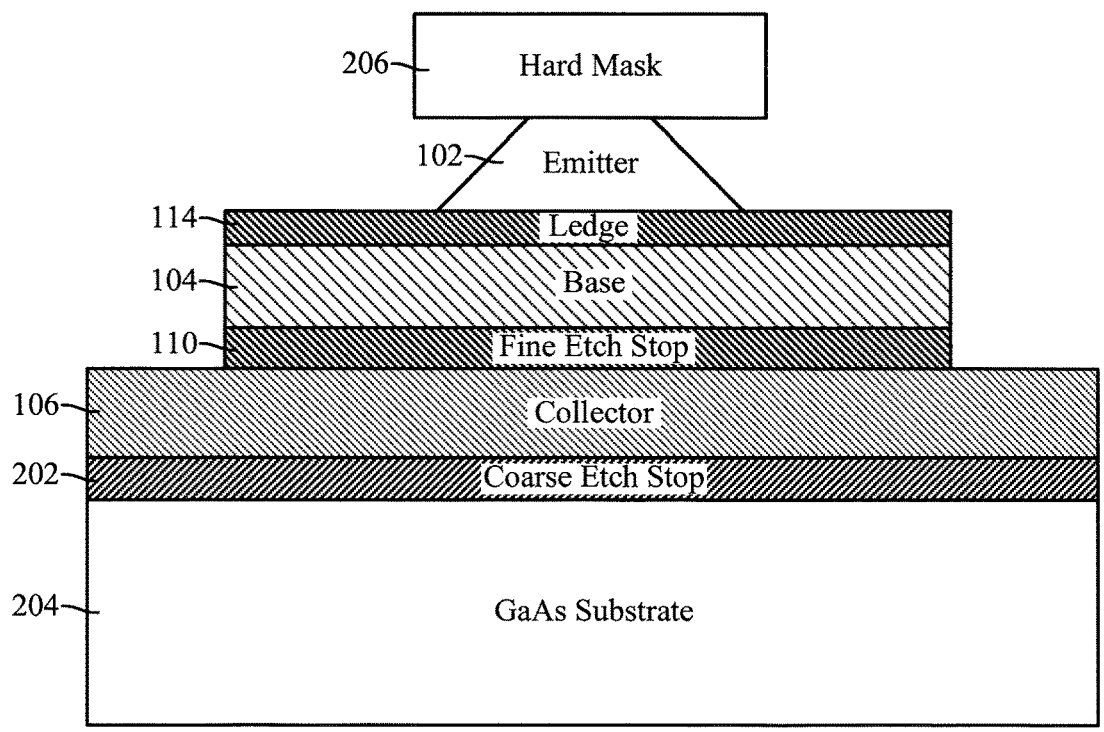
Figure 2G:
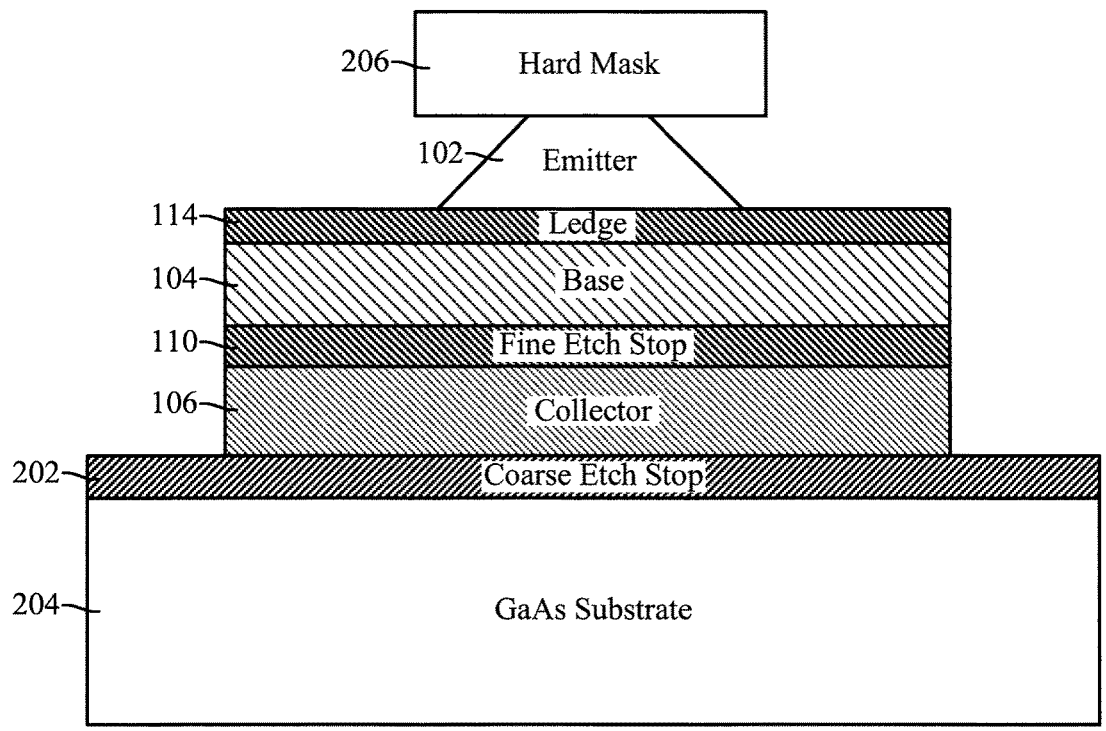
Figure 2H:
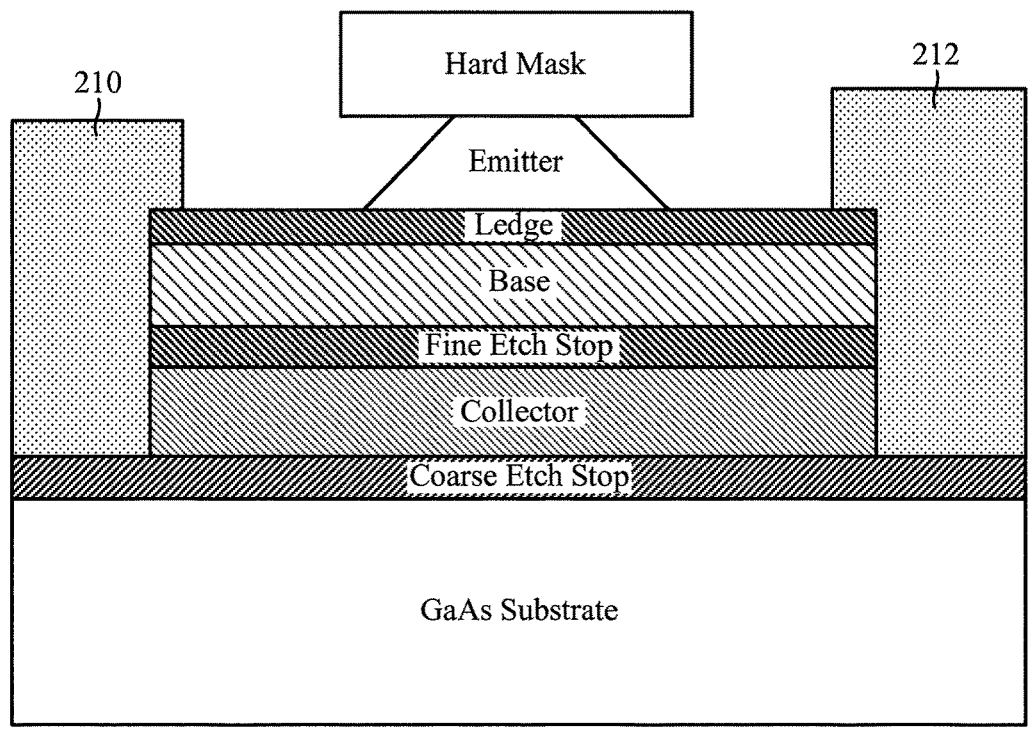
Figure 2I:
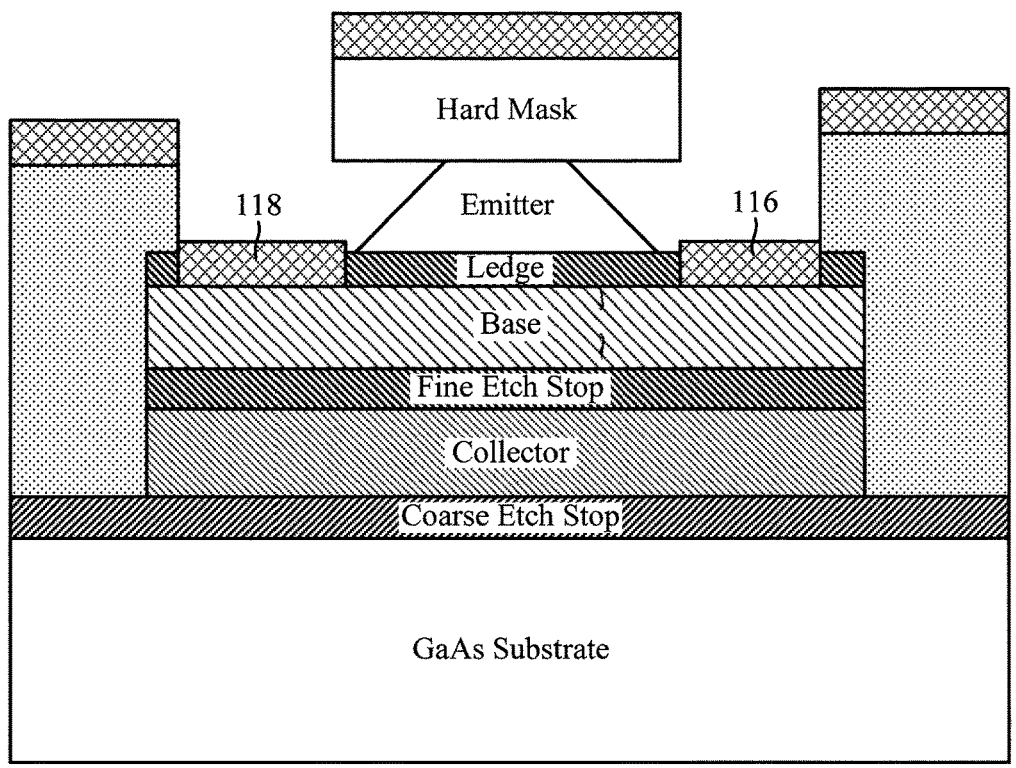
Figure 2J:
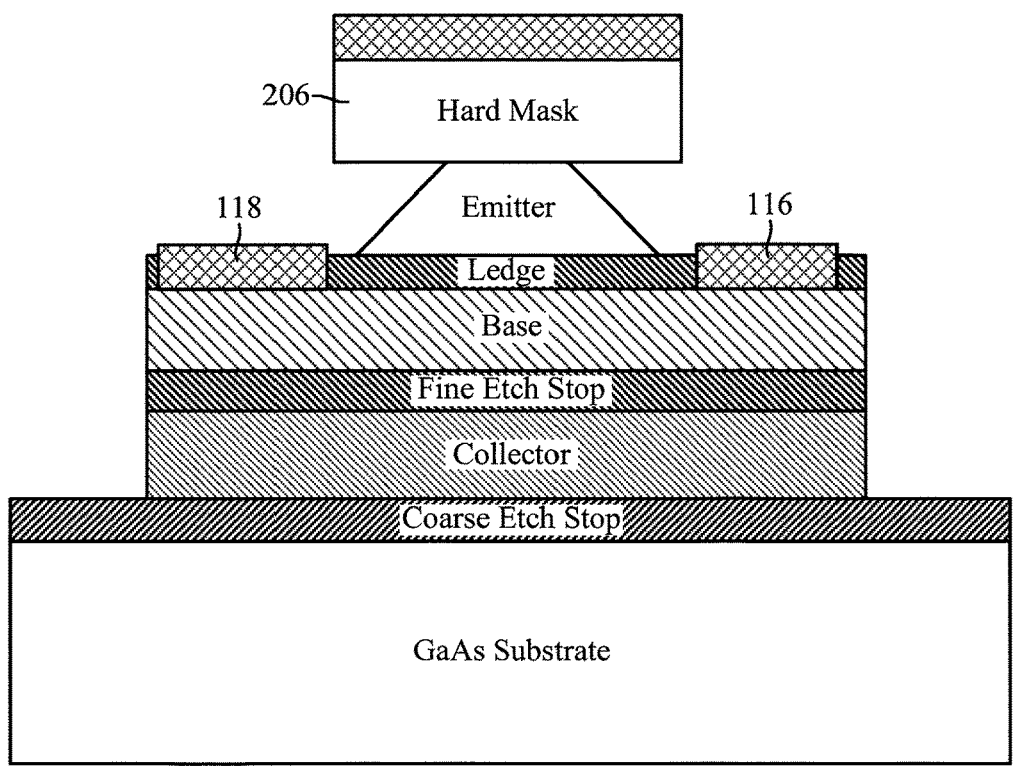
Figure 2K:
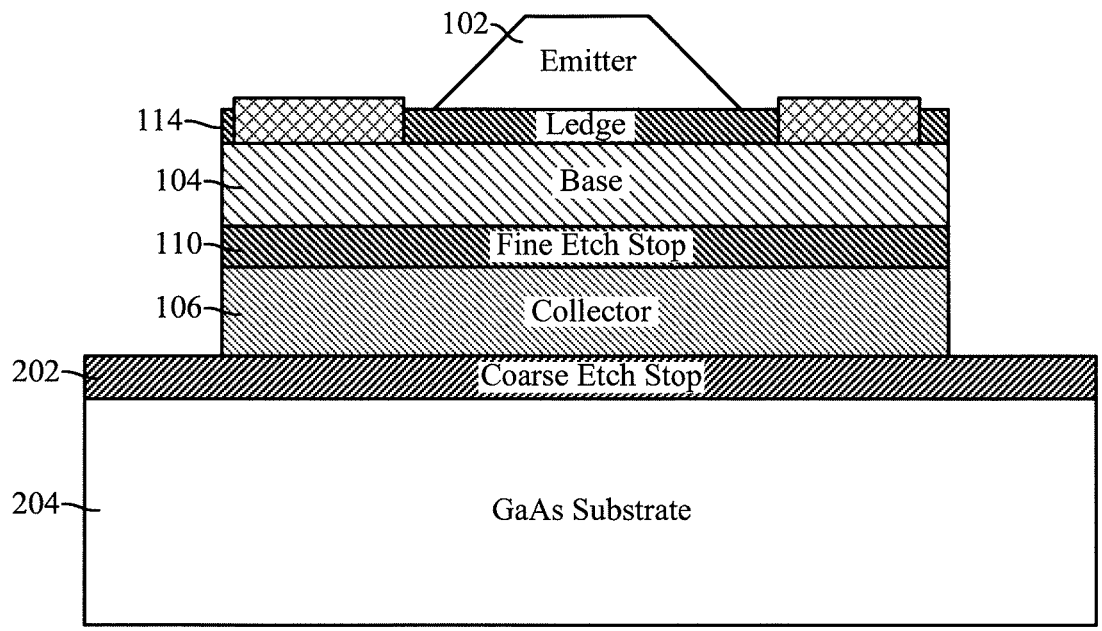
Figure 2L:
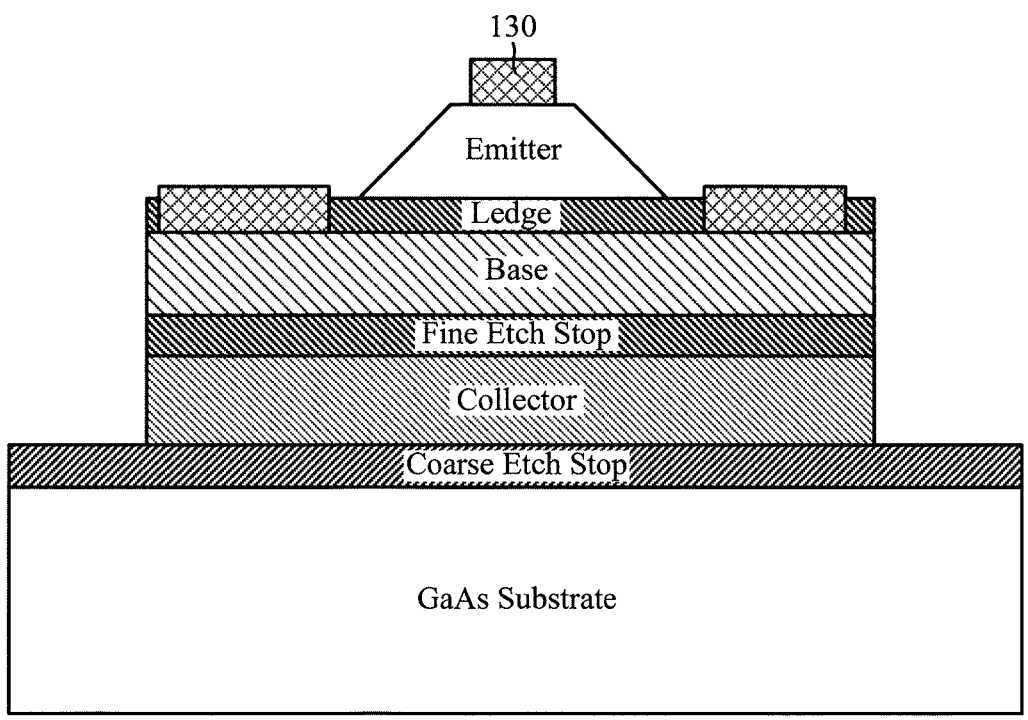
Figure 2M:
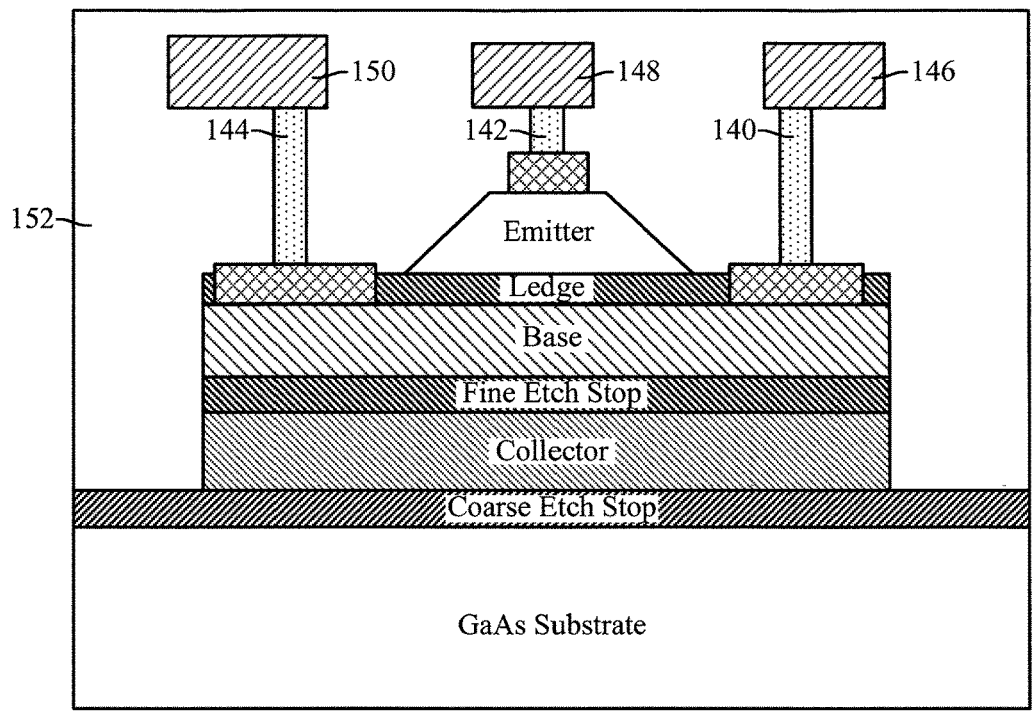
Figure 2N:
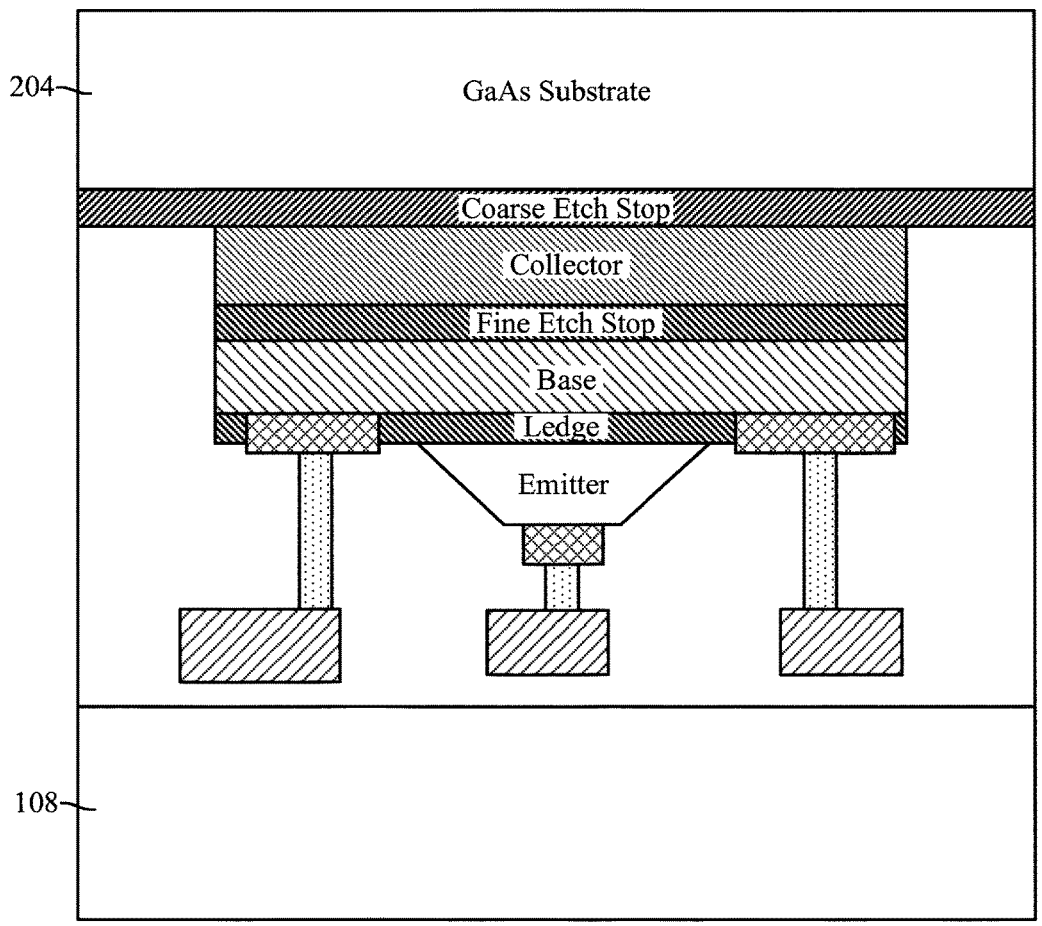
Figure 2O:
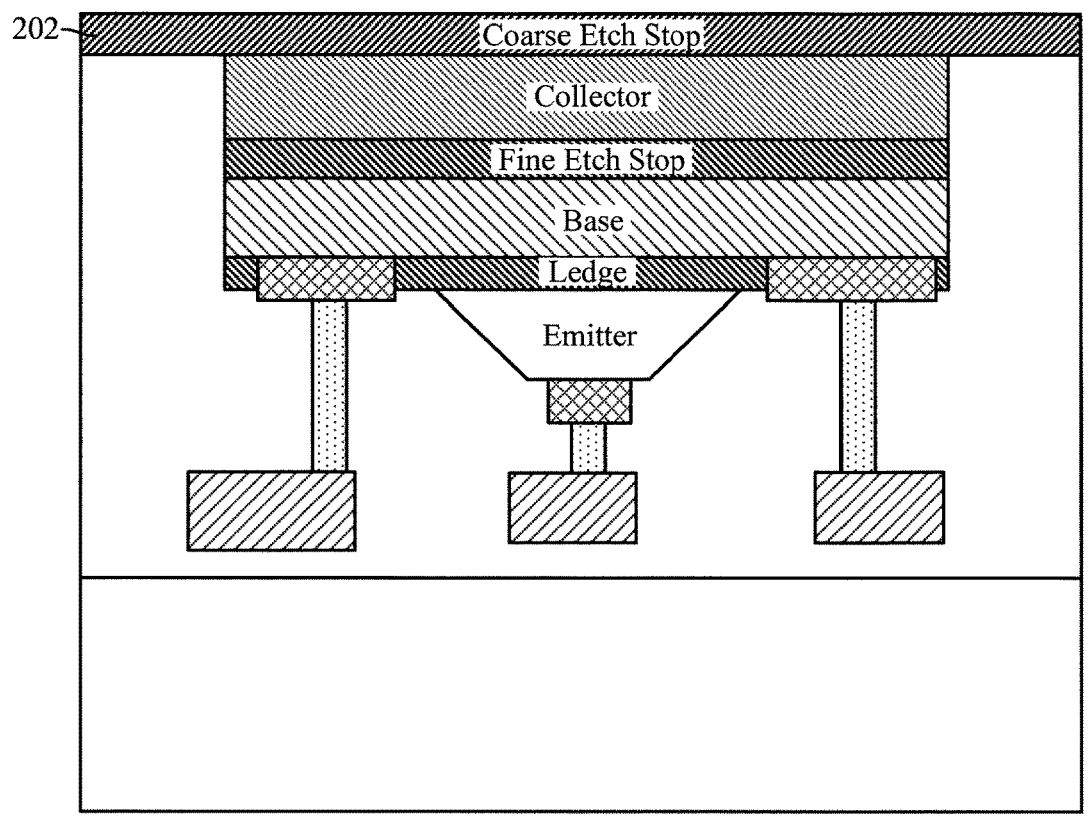
Figure 2P:
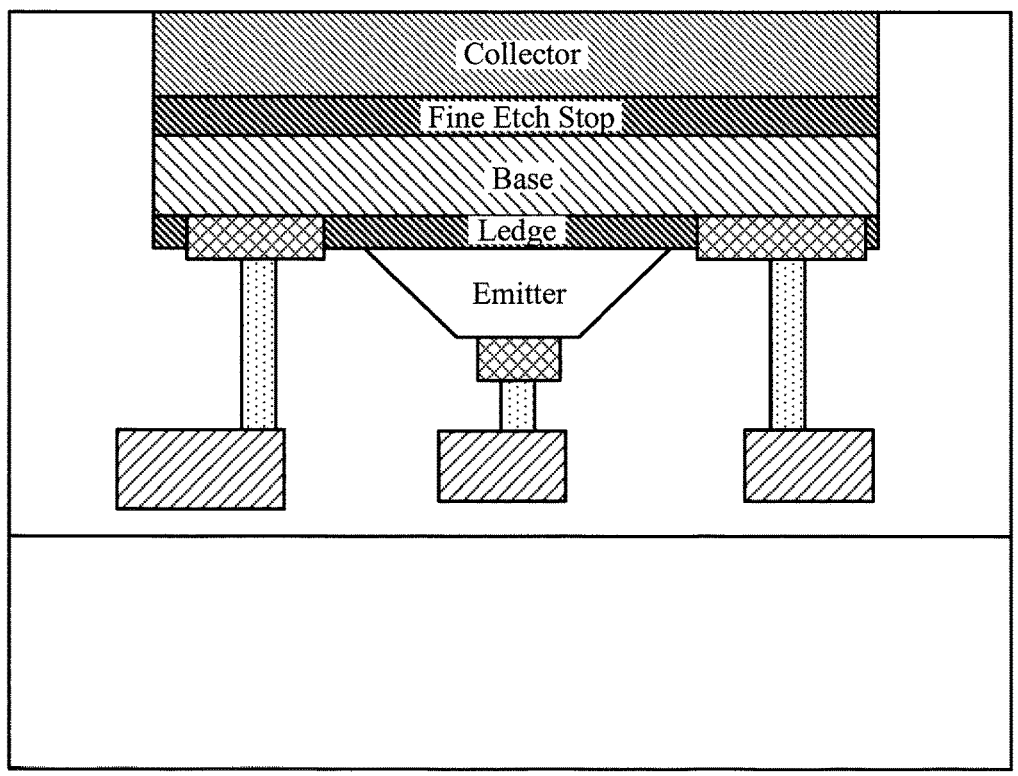
Figure 2Q:
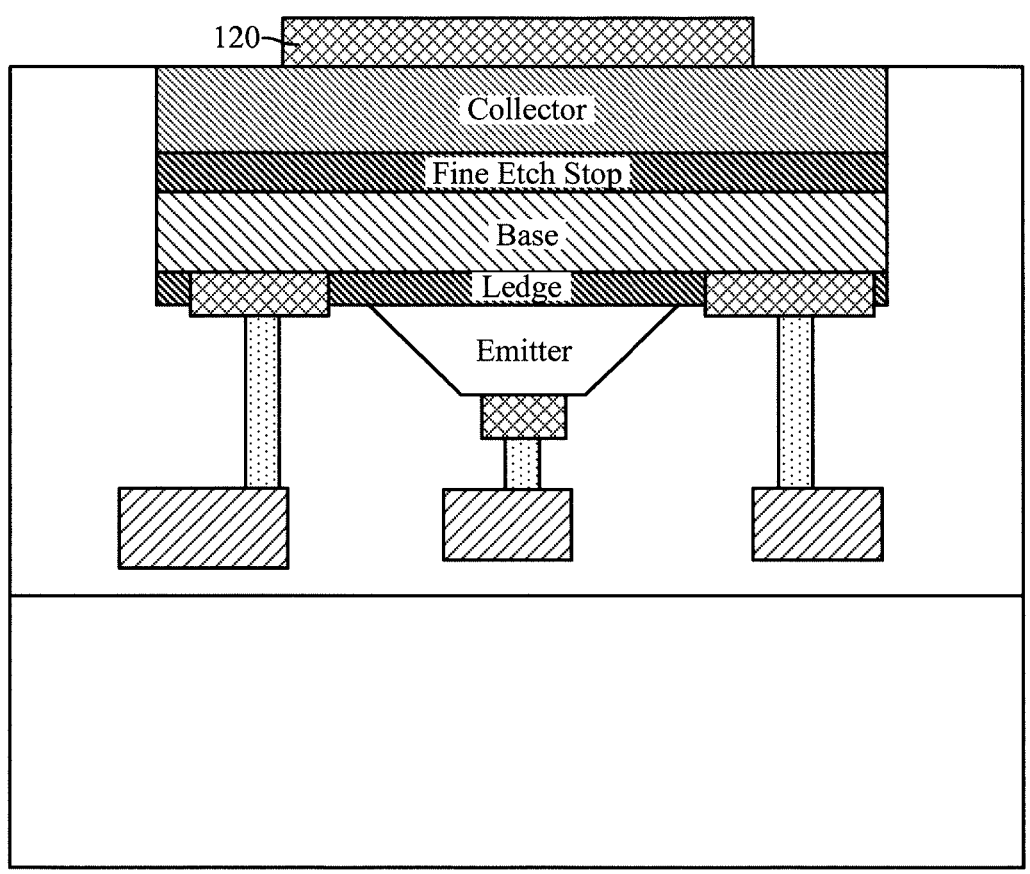

FIGS. 2A-2Q illustrate example operations for fabricating the HBT 100, in accordance with certain aspects of the present disclosure. As illustrated in FIG. 2A, a coarse etch stop layer 202 (e.g., InGaP etch stop layer) may be formed above a GaAs substrate 204. A collector region 106 (e.g., GaAs collector region), a fine etch stop layer 110 (e.g., InGaP etch stop layer), a base region 104 (e.g., GaAs base region), a ledge layer 114 (e.g., InGaP ledge layer), and an extrinsic emitter region 102 (e.g., comprising heavily N+ doped InGaAs and GaAs transition layers) may be formed above the coarse etch stop layer 202, as illustrated. As illustrated in FIG. 2B, a hard mask region 206 may be formed above the emitter region 102, followed by a GaAs etch process to etch the emitter region down to the ledge layer 114, as illustrated in FIG. 2C.

As illustrated in FIG. 2D, an InGaP etch process may be used to etch portions of the InGaP ledge layer 114 that are not below the emitter region 102. As illustrated in FIG. 2E, a GaAs base etch process may be used to etch the base region 104 down to the fine etch stop layer 110. In certain aspects, an extended base undercut may be implemented to further improve the Cbc of the HBT 100.

As illustrated in FIG. 2F, an isotropic selective InGaP etch process may be used to etch the fine etch stop layer 110 down to the collector region 106. As illustrated in FIG. 2G, an isotropic GaAs collector etch process may be used to etch the collector region 106 down to the coarse etch stop layer 202. As illustrated in FIG. 2H, photoresist regions 210, 212 may be formed, followed by base metallization to form base contacts 116, 118, as illustrated in FIG. 2I.

As illustrated in FIG. 2J, the photoresist regions 210, 212 may be removed, followed by removal of the hard mask region 206, as illustrated in FIG. 2K. As illustrated in FIG. 2L, a metallization process may be used to form the emitter contact 130, followed by the formation of vias 140, 142, 144, contact regions 146, 148, 150, and dielectric region 152 (e.g., interlayer dielectric (ILD)), followed by a planarization process for fusion wafer bonding, as illustrated in FIG. 2M. As illustrated in FIG. 2N, the HBT 100 may be fusion bonded to a Si substrate 108.

As illustrated in FIG. 2O, the GaAs substrate 204 may be removed using a grinding and selective GaAs etch process down to the coarse etch stop layer 202. As illustrated in FIG. 2P, a selective removal process may be used to remove the InGaP coarse etch stop layer 202. As illustrated in FIG. 2Q, the collector contact 120 may be formed, followed by back-end processing to form vias 140, 142, 144, 180, 182, 184, 186 and contact regions 146, 148, 150, 188, 190, 192 to facilitate electrical connection to the collector, base, and emitter regions, as illustrated in FIG. 1.

Certain aspects of the present disclosure are generally directed to the monolithic integration of RFFE components. At high RF frequencies, monolithic integration of RFFE components allows for reduction of module size and performance boost from reduction of parasitics, as compared to conventional implementations.

Figure 3:
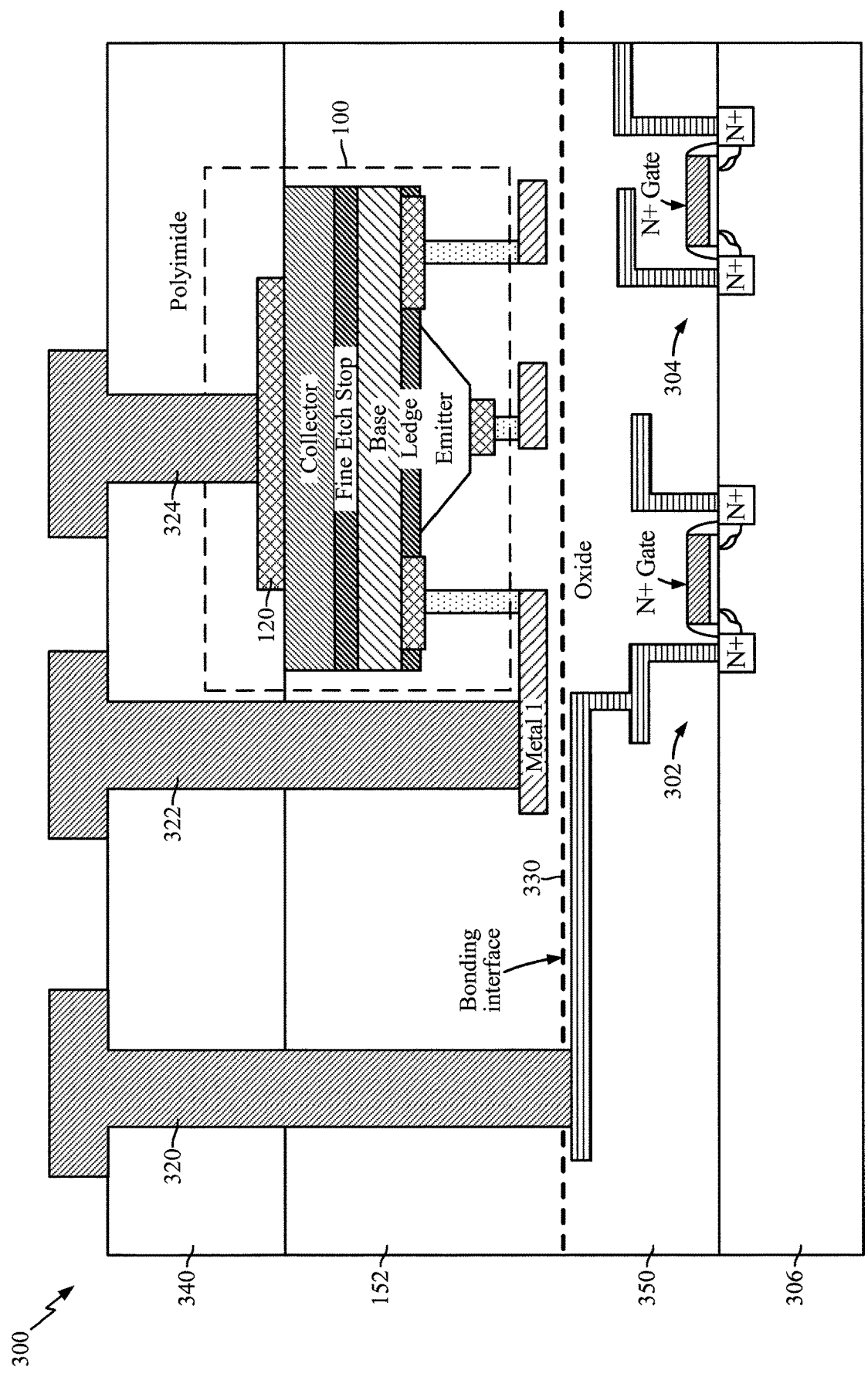
FIG. 3 is a cross-sectional view of a semiconductor device having an HBT and CMOS components disposed above a substrate, in accordance with certain aspects of the present disclosure.

FIG. 3 is a cross-sectional view of a semiconductor device 300 having the HBT 100 and CMOS components 302, 304 disposed above a substrate 306, in accordance with certain aspects of the present disclosure. The HBT 100 may be fabricated on a silicon substrate (e.g., 300 mm Si substrate), as opposed to the GaAs substrate 204, which may be later removed once the HBT 100 is fabricated to facilitate bonding of the HBT 100 to a fully processed CMOS wafer (e.g., 300 mm CMOS wafer). Vias and interconnects may be patterned after the collector contact (e.g., metal) is formed for interconnecting the HBT 100 to components on the CMOS wafer. Monolithic CMOS and HBT integration allows multiple RFFE components to be individually optimized with different semiconductor materials, such as using group III-V semiconductor for the HBT 100 for RFFE and Si CMOS for digital, control, switch, and low-noise amplifier (LNA) applications.

The semiconductor device 300 may be fabricated by performing the operations described with respect to FIGS. 2A-2M, except the HBT 100 is fabricated on a silicon substrate (e.g., 300 mm Si substrate), as opposed to the GaAs substrate 204, as described herein. The HBT 100 is then bonded to a processed CMOS wafer (e.g., via an oxide-oxide bonding process at the bonding interface 330), followed by a Si back-grind process down to the etch stop layer 202, followed by the removal of the etch stop layer 202. Collector metallization may be performed to form the collector contact 120, followed by formation of the polyamide 340 and patterning of vias 320, 322, 324 for electrical connection with the HBT 100 and CMOS components 302, 304, as illustrated.

Figure 4:
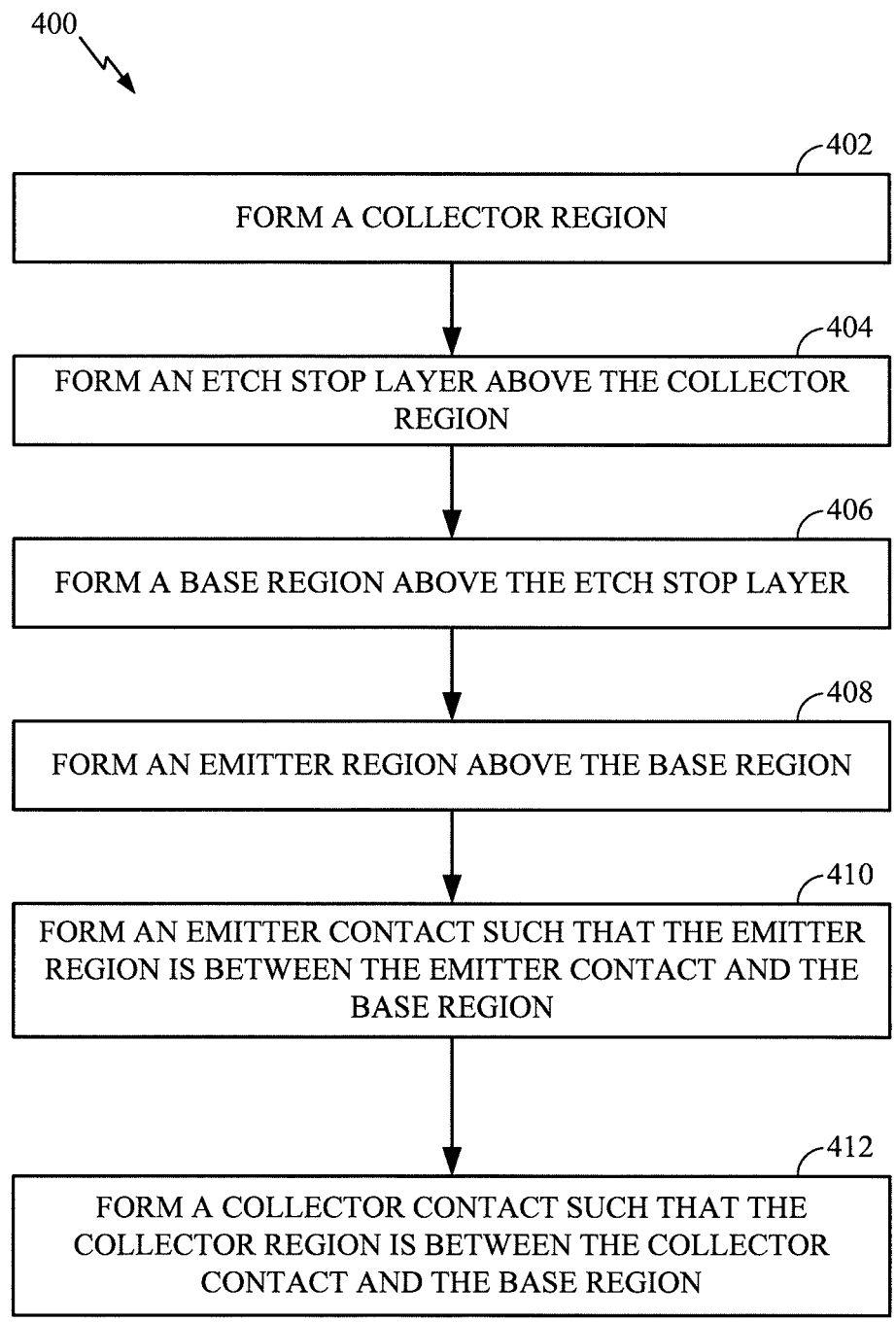
FIG. 4 is a flow diagram illustrating example operations for fabricating an integrated circuit (IC), in accordance with certain aspects of the present disclosure.

FIG. 4 is a flow diagram illustrating example operations 400 for fabricating an integrated circuit (IC), in accordance with certain aspects of the present disclosure. The operations 400 may be performed by a semiconductor processing facility for example.

The operations 400 begin, at block 402, with the semiconductor processing facility forming a collector region (e.g., collector region 106), forming an etch stop layer above the collector region at block 404, forming a base region (e.g., base region 104) above the etch stop layer (e.g., etch stop layer 110) at block 406, and at block 408, forming an emitter region (e.g., emitter region 102) above the base region. In certain aspects, the operations 400 also include, at block 410, the semiconductor processing facility forming an emitter contact (e.g., emitter contact 130) such that the emitter region is between the emitter contact and the base region, and at block 412, forming a collector contact (e.g., collector contact 120) such that the collector region is between the collector contact and the base region.

In certain aspects, the semiconductor processing facility also forms a mask region (e.g., mask region 206) above the emitter region, etches the emitter region after forming the mask region, and forms a base contact (e.g., base contact 116 or 118) adjacent to the base region after the etching of the emitter region. In certain aspects, the semiconductor processing facility may also remove the mask region, wherein the emitter contact is formed adjacent to the emitter region after the removal of the mask region. In certain aspects, the operations 400 also include the semiconductor processing facility forming another etch stop layer (e.g., etch stop layer 202), the collector region being formed above the other etch stop layer, and etching the base region and the collector region down to a top surface of the other etch stop layer prior to forming the base contact.

In some cases, the base region, the emitter region, and the collector region form a heterojunction bipolar transistor (HBT) device (e.g., HBT 100). In this case, the operations 400 also include the semiconductor processing facility forming another etch stop layer above a substrate, the collector region being formed above the other etch stop layer, forming a dielectric region (e.g., dielectric region 152) above the HBT device, bonding the dielectric region onto another substrate (e.g., substrate 108), and removing the substrate and the other etch stop layer. In certain aspects, the substrate may be a gallium arsenide (GaAs) substrate, and the other substrate may be a silicon (Si) substrate. In certain aspects, the collector contact (e.g., collector contact 120) is formed adjacent to the collector region after the removal of the substrate and the etch stop layer.

In certain aspects, the operations 400 also include the semiconductor processing facility forming a ledge region (e.g., ledge layer 114) after forming the base region and prior to forming the emitter region.

In certain aspects, the base region, the emitter region, and the collector region form an HBT device. The operations 400 may also include forming a dielectric region (e.g., dielectric region 152) above the HBT device, forming a CMOS device (e.g., CMOS component 302 or 304), forming another dielectric region (e.g., dielectric region 350) above the CMOS device, and disposing the HBT device above the CMOS device such that the dielectric region formed above the HBT device is adjacent to the other dielectric region formed above the CMOS device. In this case, the collector contact (e.g., collector contact 120) may be formed adjacent to the collector region after the disposing of the HBT device above the CMOS device, and the semiconductor processing facility may form vias (e.g., vias 320, 322, 324) for electrical connection to the HBT device and the CMOS device after the formation of the collector contact.

Figure 5:
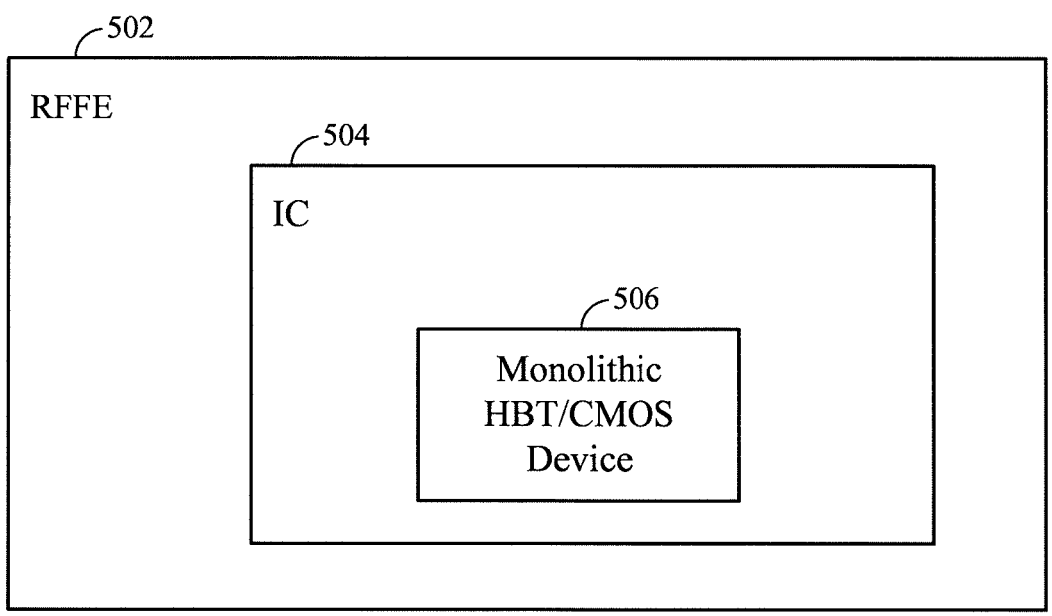
FIG. 5 is a block diagram illustrating a radio-frequency front-end (RFFE) module having an IC, in accordance with certain aspects of the present disclosure.

FIG. 5 is a block diagram illustrating a radio-frequency front-end (RFFE) module 502 having an IC 504, in accordance with certain aspects of the present disclosure. For example, the IC 504 may include a monolithic CMOS/HBT device 506, as described herein. For instance, the CMOS/HBT device 506 may include the semiconductor device 300, described with respect to FIG. 3.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An integrated circuit (IC) comprising a heterojunction bipolar transistor (HBT) device, the HBT device comprising:
   an emitter region;
   a collector region;
   a base region disposed between the emitter region and the collector region, the base region and the emitter region comprising different semiconductor materials, wherein a lateral edge of the collector region is aligned with a lateral edge of the base region;
   an etch stop layer disposed between the collector region and the base region;
   an emitter contact, wherein the emitter region is between the emitter contact and the base region; and
   a collector contact, wherein the collector region is between the collector contact and the base region.

2. The IC of claim 1, further comprising a complementary metal-oxide-semiconductor (CMOS) device adjacent to the HBT device.

3. The IC of claim 2, further comprising a substrate, wherein the CMOS device is disposed between the HBT device and the substrate.

4. The IC of claim 2, further comprising a substrate, wherein the CMOS device and the HBT device are disposed above the substrate.

5. The IC of claim 2, wherein the HBT device comprises a group III-V semiconductor and wherein the CMOS device comprises a different semiconductor.

6. The IC of claim 1, further comprising a ledge region, wherein a first portion of the ledge region is disposed between the emitter region and the base region and wherein a second portion of the ledge region extends beyond a lateral edge of the emitter region.

7. The IC of claim 6, further comprising a base contact disposed adjacent to the base region.

8. The IC of claim 6, wherein the ledge region and the etch stop layer comprise indium gallium phosphide (InGaP).

9. The IC of claim 6, wherein the base region and the collector region comprise gallium arsenide (GaAs).

10. The IC of claim 1, wherein the emitter region is trapezoidal shaped.

11. The IC of claim 10, wherein a first side of the trapezoidal-shaped emitter region is longer than a second side of the trapezoidal-shaped emitter region, wherein the first side and the second side are bases of the trapezoidal-shaped emitter region, and wherein the first side is disposed closer to the base region than the second side.

12. The IC of claim 1, wherein at least one of the collector region or the base region comprises gallium arsenide (GaAs).

13. The IC of claim 12, wherein the emitter region comprises indium gallium arsenide (InGaAs).

14. The IC of claim 1, wherein another lateral edge of the collector region is aligned with another lateral edge of the base region.

* * * * *